(12) United States Patent
Hooge et al.

(10) Patent No.: US 11,998,945 B2
(45) Date of Patent: Jun. 4, 2024

(54) METHODS AND SYSTEMS TO MONITOR, CONTROL, AND SYNCHRONIZE DISPENSE SYSTEMS

(71) Applicant: Tokyo Electron Limited, Tokyo (JP)

(72) Inventors: Joshua Hooge, Austin, TX (US);
Michael Carcasi, Austin, TX (US);
Mark Somervell, Hillsboro, OR (US)

(73) Assignee: Tokyo Electron Limited, Tokyo (JP)

( * ) Notice: Subject to any disclaimer, the term of this patent is extended or adjusted under 35 U.S.C. 154(b) by 903 days.

(21) Appl. No.: 17/037,073

(22) Filed: Sep. 29, 2020

(65) Prior Publication Data

US 2021/0129174 A1 May 6, 2021

Related U.S. Application Data

(60) Provisional application No. 62/930,090, filed on Nov. 4, 2019.

(51) Int. Cl.
*B05C 11/10* (2006.01)
*B05C 5/02* (2006.01)
(Continued)

(52) U.S. Cl.
CPC ............ *B05D 1/005* (2013.01); *B05C 5/0225* (2013.01); *B05C 11/1013* (2013.01);
(Continued)

(58) Field of Classification Search
None
See application file for complete search history.

(56) References Cited

U.S. PATENT DOCUMENTS

| 4,396,943 A | 8/1983 | Lord et al. |
| 6,000,862 A | 12/1999 | Okuda et al. |

(Continued)

FOREIGN PATENT DOCUMENTS

| JP | 2003053244 A | 2/2003 |
| JP | 2003093959 A | 4/2003 |

(Continued)

OTHER PUBLICATIONS

Flack, W.W. et al, "A Mathematical Model for Spin Coating of Polymer Resists," Journal of Applied Physics, 56, 1199, Aug. 1984, 9 pages.

(Continued)

*Primary Examiner* — Michael P. Rodriguez
(74) *Attorney, Agent, or Firm* — Slater Matsil, LLP

(57) ABSTRACT

Embodiments are described herein to monitor and synchronize dispense systems for processing systems. For one embodiment, pressure and flow rate sensors are used to determine a delay between a flow change event and an increase in flow rate, and this delay is used to detect defects or conditions within the dispense system. For one embodiment, dispense system operation is synchronized using flow rate sensors. For one embodiment, simulation models or complex dispense profiles based upon combined pressure/flow/spin/concentration sensor data are used to enable complex process recipes. For one embodiment, dispense-to-dispense pressure and/or flow rate measurements are used to detect dispense parameters and defects. For one embodiment, cameras and image processing are used to detect flow rates from the dispense nozzle, and dispense-to-dispense measurements are used to detect dispense parameters and defects. One or more of the disclosed embodiments can be used in processing systems for microelectronic workpieces.

19 Claims, 7 Drawing Sheets

(51) Int. Cl.
    *B05C 13/02*     (2006.01)
    *B05D 1/00*     (2006.01)
    *B05D 1/26*     (2006.01)
    *G05D 7/06*     (2006.01)
    *H01L 21/67*     (2006.01)

(52) U.S. Cl.
    CPC .......... *B05C 11/1023* (2013.01); *B05C 13/02* (2013.01); *B05D 1/26* (2013.01); *G05D 7/0641* (2013.01); *H01L 21/67017* (2013.01); *H01L 21/67051* (2013.01); *H01L 21/67253* (2013.01)

(56) References Cited

U.S. PATENT DOCUMENTS

| | | | |
|---|---|---|---|
| 6,076,979 | A | 6/2000 | Mimasaka et al. |
| 6,693,708 | B1 | 2/2004 | Hunter |
| 6,707,545 | B1 | 3/2004 | Hunter |
| 6,721,045 | B1 | 4/2004 | Hunter |
| 7,012,684 | B1 | 3/2006 | Hunter |
| 7,897,196 | B2 | 3/2011 | Cedrone et al. |
| 7,979,165 | B2 | 7/2011 | Gotoh |
| 8,055,372 | B2 | 11/2011 | Kataoka et al. |
| 8,352,200 | B2 | 1/2013 | Contini et al. |
| 8,975,595 | B2 | 3/2015 | Norton et al. |
| 10,211,110 | B1 | 2/2019 | Kamakura et al. |
| 2003/0097983 | A1 | 5/2003 | Kitano et al. |
| 2005/0053874 | A1 | 3/2005 | Yoshihara et al. |
| 2005/0148203 | A1 | 7/2005 | Shirley et al. |
| 2006/0137419 | A1 | 6/2006 | Mizohata |
| 2007/0035179 | A1 | 2/2007 | Kling et al. |
| 2007/0154210 | A1 | 7/2007 | Lin |
| 2007/0254094 | A1 | 11/2007 | Lin |
| 2011/0286738 | A1 | 11/2011 | Noda et al. |
| 2013/0260574 | A1 | 10/2013 | Masuhara et al. |
| 2015/0078920 | A1 | 3/2015 | Chou |
| 2016/0090565 | A1* | 3/2016 | Liu .......... G03F 7/426 510/109 |
| 2016/0246307 | A1 | 8/2016 | Nogami |
| 2017/0255208 | A1 | 9/2017 | Hirota |
| 2018/0350636 | A1 | 12/2018 | Fukuda et al. |
| 2019/0103268 | A1* | 4/2019 | Kang .......... H01L 21/0274 |
| 2019/0240689 | A1 | 8/2019 | Girvin et al. |
| 2019/0278305 | A1 | 9/2019 | Takijiri |
| 2020/0004153 | A1 | 1/2020 | Cheng et al. |
| 2022/0269177 | A1 | 8/2022 | Carcasi et al. |

FOREIGN PATENT DOCUMENTS

| | | |
|---|---|---|
| JP | 2006184989 A | 7/2006 |
| JP | 2007273792 A | 10/2007 |
| JP | 2013229501 A | 11/2013 |
| JP | 2018137367 A | 8/2018 |
| KR | 101842119 B1 | 3/2018 |
| WO | 0229390 W | 4/2002 |

OTHER PUBLICATIONS

PCT International Search Report and Written Opinion in counterpart PCT application PCT/US2020/053306, issued Jan. 15, 2021, 13 pages.

\* cited by examiner

METHODS AND SYSTEMS TO MONITOR, CONTROL, AND SYNCHRONIZE DISPENSE SYSTEMS

This application claims priority to U.S. Provisional Patent Application No. 62/930,090, entitled, "METHODS AND SYSTEMS TO MONITOR, CONTROL, AND SYNCHRONIZE DISPENSE SYSTEMS," filed Nov. 4, 2019; the disclosure of which is expressly incorporated herein, in its entirety, by reference.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, process flows are being requested to reduce feature size while maintaining structure integrity for various patterning processes.

As film thickness and critical dimension (CD) budgets continue to shrink, tighter and tighter uniformity control is needed for coating liquids dispensed from dispense systems for processing systems that are used to manufacture microelectronic workpieces. For example, in a spin coat process, the coating liquid often travels through a filter and a pump and then through a nozzle onto a microelectronic workpiece, such as a semiconductor wafer, which is typically spinning on a rotating substrate holder. The dispense system also includes valves, reservoirs, supply tanks, and/or other components. The cleanliness of the liquid and flow rate at which the liquid is dispensed onto the wafer at any given time are important to minimize defects and to keep CDs well controlled. For example, gas or particles introduced in the filter will decrease the available channels for liquid to pass through the filter membrane and will increase or cause variations in the pressure drop across the filter.

In a dispense system with no gas bubbles, the liquid is relatively incompressible, and a pressure change will almost instantly cause a change in flow rate. The flow rate at a given pressure is also related to the viscosity, and viscosity is an indication of the polymer content in the liquid or inversely the solvent concentration in the liquid. In contrast, bubbles present anywhere in the dispense system will compress under increased pressure. As such, the presence of gas bubbles in the liquid causes a delay between applied pressure and flow rate change. These flow rate delays degrade the stability of the dispense rate. Bubbles also inhibit filter performance by blocking membrane channels, can be nucleation sites for smaller particles to aggregate into larger ones, and can cause polymer components of the liquid to drop out of solution.

Coating thickness of the dispense liquid on the substrate is also an important parameter to control. The final coating thickness of the dispensed liquid across the spinning substrate for a microelectronic workpiece is a complex function of many variables including the rotation profile through time, the flow rate profile through time, and the solvent concentration through time. As the dispense volume is decreased in more advanced process flows, the acceptable combinations of these variables to provide a uniform thickness also decrease. Further, the importance of synchronicity between the dispense system and substrate rotation increases.

FIG. 1A (Prior Art) is a diagram of an example embodiment for a processing system 100 including dispense system 102 where conditions, such as gas bubbles, can arise and cause defects. The dispense system 102 includes a filter 104, a pump 106 with a pressure sensor 116, a valve 112, a flow sensor 118, and a nozzle 114. A supply tank 120 supplies a liquid 122 to the dispense system 102. Within the dispense system 102, the liquid 122 passes through the filter 104, the pump 106, the valve 112, the flow sensor 118, and the nozzle 114. The liquid 122 is then dispensed from the nozzle 114 to a substrate 109 for a microelectronic workpiece. The substrate 109 is held on a substrate holder 108, such as a vacuum chuck. The substrate holder 108 is rotated at a controlled speed by a spin motor 110 to facilitate distribution of the liquid 122 on the surface of the substrate 109. The liquid 122 can be a photoresist (PR) or other desired liquid.

In operation, the dispense system 102 uses the filter 104, the pump 106, the valve 112, and the nozzle 114 to dispense the liquid 112 on the rotating substrate 109. Available sensing apparatus include the pressure sensor 116 and the flow sensor 118 as well as an encoder (not shown) that tracks the rotations of the spin motor 110. For a typical dispense of liquid 122, pressure is brought to a selected set point using the pump 106 before the valve 112 is opened. This controlled pressure helps to maintain a consistent dispense of the liquid 122 through the nozzle 114. The quality and volume of this dispense is controlled by the pressure set point and adjustments to the opening and closing speeds for the valve 112.

To control dispense volume, a process engineer for the dispense system 102 adjusts pressure for the pump 106 by monitoring the pressure sensor 116. In addition, the process engineer will adjust the valve 112 to generate a visually acceptable dispense, such as a dispense with no drips and no erratic start. Although a flow sensor 118 is often included between the valve 112 and the nozzle 114, the flow sensor 118 is often not used for dispense control.

FIG. 1B (Prior Art) is an example embodiment of a diagram 150 for a dispense using the dispense system 102 shown in FIG. 1A (Prior Art). As shown, the pressure 152 for the liquid is controlled to be constant at a selected set point. The spin rotation rate 156 for the spin motor 110 is set to a selected level prior to the dispense of the liquid. The valve 112 is then opened and a flow rate 154 preferably remains at the same level for the dispense.

In addition to pressure control, video monitoring has also been provided so that the process engineer can visually inspect the quality of the dispense. For example, the dispense system 102 can use a camera (e.g., operating at 120 frames-per-second) to allow monitoring of the nozzle angle and position, nozzle contamination, dispense presence (on/off), dispense timing (start delay, end delay), bubble presence, and suckback position as well as maintenance support for suckback setup and nozzle centering.

In prior dispense techniques, however, gas bubbles can form in the liquid that adversely affect defect performance and dispense consistency. For example, bubbles can form in the filter 104 and remain in the liquid 122 as it travels through the dispense system 102.

FIG. 1C (Prior Art) is an example embodiment of a diagram 170 showing the flow rate at the nozzle 114 in a first case 172 where bubbles are not formed or present and a second case 174 where gas bubbles are formed or are present for a liquid 122 flowing through the nozzle 114. For the first case 172, no bubbles have been formed or are present in the liquid 122 in the filter 104 or tubing for the dispense system 102. As such, a high flow rate and a fully laminar flow profile are achieved for the liquid 122 flowing through the nozzle 114 within 0.1 seconds after pressure is applied in the dispense system 102. For example, a high flow rate of 0.08 meters-per-second (m/s) can be achieved in the center of the liquid 122 flowing through the nozzle 114. In contrast for a second case 174, bubbles have been formed or are present in the liquid in the filter 104 or tubing for the dispense system 102, and a reduced flow rate occurs for the liquid 122 flowing through the nozzle 114 after pressure is applied in the dispense system 102. For example, at the 0.1 seconds after applied pressure, the flow rate for this second case is delayed and is greatly reduced as compared to the first case 172 due to the existence of the bubbles within the liquid 122. For one example, the flow rate can be 0.03 m/s for the liquid 122 flowing through the nozzle 114 as compared to the 0.08 m/s for the first case 172.

SUMMARY

Embodiments are described herein to monitor and synchronize dispense systems for processing systems. Different or additional features, variations, and embodiments can also be implemented, and related systems and methods can be utilized as well.

For one embodiment, pressure and flow rate sensors are used to determine a delay between a flow change event, such as application of pressure or opening of a valve, and an increase in flow rate, and this delay is used to detect and quantify the gas in the dispense system, to match performance of different modules, and/or to detect other defects or conditions within the dispense system.

In one aspect, a system is disclosed to dispense liquid for a microelectronic workpiece processing system including a pump coupled to receive a liquid to be dispensed, a nozzle coupled to receive the liquid from the pump and to dispense the liquid on a microelectronic workpiece, a pressure sensor coupled to sense a pressure in the liquid, a flow sensor coupled to sense a flow rate for the liquid, and a controller coupled to receive pressure information from the pressure sensor and flow rate information from the flow sensor and configured to determine one or more conditions in the system based upon a delay between a flow change event and increase in flow rate.

In additional embodiments, the pressure sensor is coupled between the pump and the nozzle, and the flow sensor is coupled between the pump and the nozzle. In further embodiments, the flow change event includes a change in pressure. In further embodiments, the system includes a valve, and the flow change event includes opening of the valve. In still further embodiments, the valve is coupled between the pump and the nozzle. In further embodiments, the one or more conditions includes at least one of gas bubbles in the system, a condition of a filter in the system, or a viscosity change for the liquid. In further embodiments, the one or more conditions includes a condition associated with reloading the pump.

In another aspect, a method is disclosed to dispense liquid for a microelectronic workpiece processing system including receiving a liquid to be dispensed with a dispense system, causing a flow change event for the liquid within the dispense system, sensing a flow rate for the liquid after causing the flow change event, and determining one or more conditions in the dispense system based upon a delay between the flow change event and a change in flow rate.

In additional embodiments, the flow change event includes applying pressure to the liquid within the dispense system, and the determining includes determining one or more conditions in the dispense system based upon a delay between the application of pressure and an increase in flow rate. In further embodiments, the flow change event includes opening a valve to allow flow of the liquid within the dispense system, and the determining includes determining one or more conditions in the dispense system based upon a delay between the opening of the valve and a change in flow rate. In further embodiments, the one or more conditions includes at least one of gas bubbles in the dispense system, a condition of a filter in the dispense system, or a viscosity change for the liquid.

For one embodiment, dispense system operation is synchronized using flow rate sensors. For example, spin rates for the substrate can be synchronized with flow rates.

In one aspect, a system is disclosed to dispense liquid for a microelectronic workpiece processing system including a nozzle coupled to receive a liquid and to dispense the liquid on a microelectronic workpiece, a flow sensor coupled to sense a flow rate for the liquid, a substrate holder for the microelectronic workpiece, a spin motor coupled to rotate the substrate holder at a spin rate, and a controller coupled to receive flow rate information from the flow sensor and spin rate information from the spin motor and configured to synchronize the flow rate and the spin rate.

In additional embodiments, the controller is configured to achieve a target uniformity in thickness for the liquid applied to the microelectronic workpiece. In further embodiments, the controller is configured to obtain the flow rate information and the spin rate information at a sample rate of at least one sample every 50 milliseconds or less. In further embodiments, the controller is further configured to perform at least one of a feedback adjustment by adjusting a spin rate used to process a subsequent microelectronic workpiece or a feedforward adjustment by adjusting a spin rate used to process a same microelectronic workpiece in a later process step.

In another aspect, a method is disclosed to dispense liquid for a microelectronic workpiece processing system including receiving a liquid to be dispensed with a dispense system, dispensing the liquid on a microelectronic workpiece, rotating the microelectronic workpiece at a spin rate during the dispensing, sensing a flow rate for the liquid during the dispensing, and synchronizing the flow rate and the spin rate.

In additional embodiments, the synchronizing achieves a target uniformity in thickness for the dispensing of the liquid on the microelectronic workpiece.

For one embodiment, simulation models or complex dispense profiles based upon combined pressure/flow/spin/concentration sensor data can be used to enable more complex process recipes, identify bottle changes, enable tighter control of thickness specifications, and/or other purposes. Filter lifetimes, chemical viscosity changes, and/or other operational parameters can also be monitored with the techniques described.

In one aspect, a system is disclosed to dispense liquid for a microelectronic workpiece processing system including a pump coupled to receive a liquid to be dispensed, a nozzle coupled to receive the liquid from the pump and to dispense the liquid on a microelectronic workpiece, a pressure sensor coupled to sense a pressure in the liquid, a flow sensor coupled to sense a flow rate for the liquid, a substrate holder for the microelectronic workpiece, a spin motor coupled to rotate the substrate holder at a spin rate, and a controller. The controller is coupled to receive pressure information from the pressure sensor, flow rate information from the flow sensor, and spin rate information from the spin motor; and the controller is further configured to adjust at least one of the pressure, the flow rate, or the spin rate to achieve target parameters.

In additional embodiments, the pressure sensor is coupled between the pump and the nozzle, and the flow sensor is coupled between the pump and the nozzle. In further embodiments, the controller is further configured to apply one or more process models to adjust the pressure, the flow rate, or the spin rate. In further embodiments, the pump includes a hydraulic pump having a piston controlled by the controller, and a displacement reading from the hydraulic pump is used as the pressure sensor. In further embodiments, the system includes a mixer coupled between the pump and the nozzle and configured to mix the liquid with one or more solvents, and the controller is configured to adjust a solvent mixing by the mixer based upon the one or more process models. In still further embodiments, the controller is configured to adjust at least one of the flow rate, the spin rate, or the solvent mixing based upon a detected change in at least one of the other of the flow rate, the spin rate, or the solvent mixing.

In another aspect, a method is disclosed to dispense liquid for a microelectronic workpiece processing system including receiving a liquid to be dispensed with a dispense system, applying pressure to the liquid within the dispense system, dispensing the liquid on a microelectronic workpiece, rotating the microelectronic workpiece at a spin rate during the dispensing, sensing a flow rate for the liquid during the dispensing, and adjusting at least one of the pressure, the flow rate, or the spin rate to achieve target parameters.

In additional embodiments, the method includes applying one or more process models to adjust the pressure, the flow rate, or the spin rate. In further embodiments, the method includes mixing the liquid with one or more solvents to produce a solvent concentration in the liquid prior to the dispensing, detecting a change in at least one the flow rate, the spin rate, or the solvent concentration, and adjusting at least one of the flow rate, the spin rate, or the solvent mixing based upon the detecting.

For one embodiment, dispense-to-dispense pressure and/or flow rate measurements are used to detect dispense parameters such as gas bubbles, viscosity changes, particles, and/or other parameters.

In one aspect, a system is disclosed to dispense liquid for a microelectronic workpiece processing system including a filter coupled to receive a liquid to be dispensed, a pump coupled to receive the liquid from the filter, a nozzle coupled to receive the liquid from the pump and to dispense the liquid on a microelectronic workpiece, a pressure sensor coupled to sense a pressure of the liquid in the system, a flow sensor coupled to sense a flow rate of the liquid in the system, and a controller. The controller is coupled to receive pressure information from the pressure sensor and flow rate information from the flow sensor, and the controller is configured to determine one or more conditions in the system based upon a comparison of pressure or flow rate or pressure and flow rate over multiple dispenses.

In additional embodiments, the one or more conditions include at least one of gas bubbles introduced into the system, viscosity changes for the liquid, or a condition of the filter. In further embodiments, the pressure sensor is associated with the pump or is associated with the filter.

In another aspect, a method is disclosed to dispense liquid for a microelectronic workpiece processing system including receiving a liquid to be dispensed with a dispense system; dispensing the liquid on a microelectronic workpiece; sensing a pressure for the liquid during the dispensing; sensing a flow rate for the liquid during the dispensing; repeating the receiving, dispensing, and sensing over multiple dispenses of the liquid; and determining one or more conditions in the system based upon a comparison of pressure or flow rate or pressure and flow rate over the multiple dispenses.

In additional embodiments, the one or more conditions includes at least one of gas bubbles introduced into the system, viscosity changes for the liquid, or a condition of the filter.

For one embodiment, cameras and image processing are used to detect flow rates from the dispense nozzle, and this flow rate detection is compared dispense-to-dispense to detect dispense parameters such as gas bubbles, viscosity changes, particles, and/or other parameters.

In one aspect, a system is disclosed to dispense liquid for a microelectronic workpiece processing system a pump coupled to receive a liquid to be dispensed, a nozzle coupled to receive the liquid from the pump and to dispense the liquid on a microelectronic workpiece, a camera coupled to capture images for the liquid being dispensed through the nozzle where the camera is configured to capture image data at 500 frames-per-second or greater, and a controller coupled to receive the image data and to determine flow rate for the liquid based upon the image data. The controller is also configured to determine one or more conditions in the system based upon a comparison of the flow rate over multiple dispenses.

In additional embodiments, the one or more conditions includes at least one of gas bubbles introduced into the system, viscosity changes for the liquid, or a condition of the filter. In further embodiments, the camera is configured to capture image data at 2000 frames-per-second or greater.

In another aspect, a method is disclosed to dispense liquid for a microelectronic workpiece processing system including receiving a liquid to be dispensed with a dispense system; dispensing the liquid through a nozzle onto a microelectronic workpiece; capturing images of the dispensing of the liquid through the nozzle at 500 frames-per-second or greater; generating a flow rate for the liquid during the dispensing based upon the capturing; repeating the receiving, dispensing, capturing, and generating over multiple dispenses of the liquid; and determining one or more conditions in the system based upon a comparison of flow rate over the multiple dispenses.

In additional embodiments, the one or more conditions includes at least one of gas bubbles introduced into the system, viscosity changes for the liquid, or a condition of the filter. In further embodiments, the capturing occurs at 2000 frames-per-second or greater.

Different or additional features, variations, and embodiments can also be implemented and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Embodiments are described herein to monitor and synchronize dispense systems for processing systems. A variety of advantages and implementations can be achieved while taking advantage of the process techniques described herein.

Figure 1A:
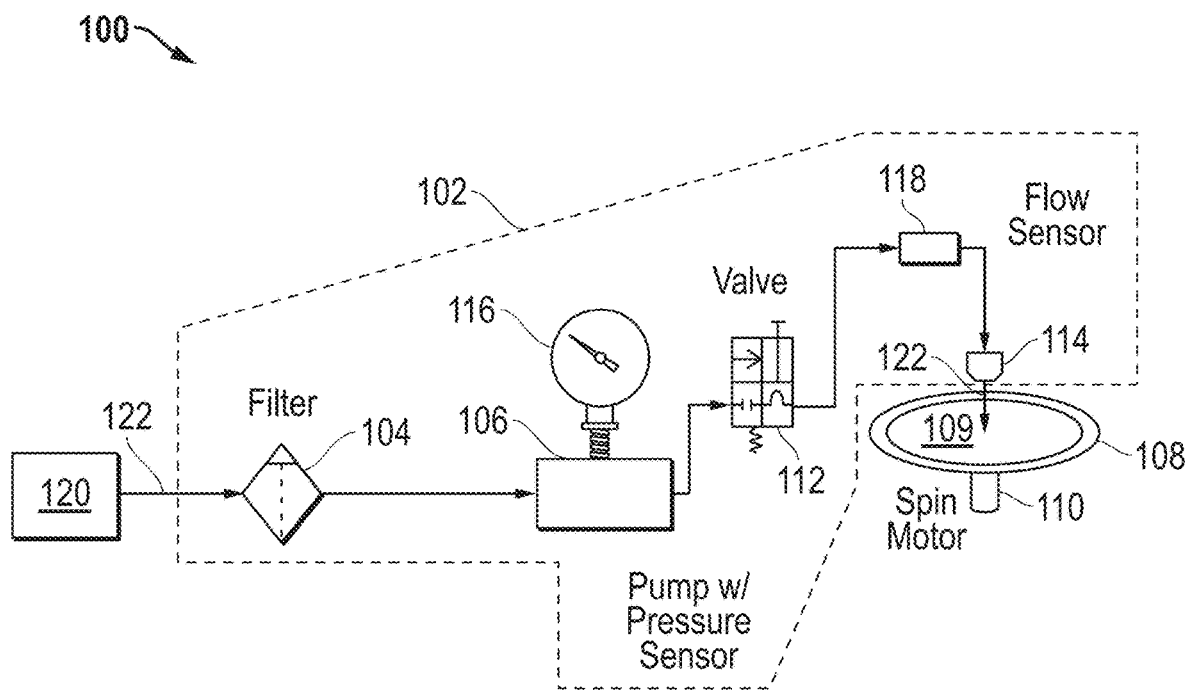
FIGS. 1A-1C (Prior Art) provide an example embodiment for a processing system including dispense system where conditions such as gas bubbles can arise and cause defects.
Figure 1B:
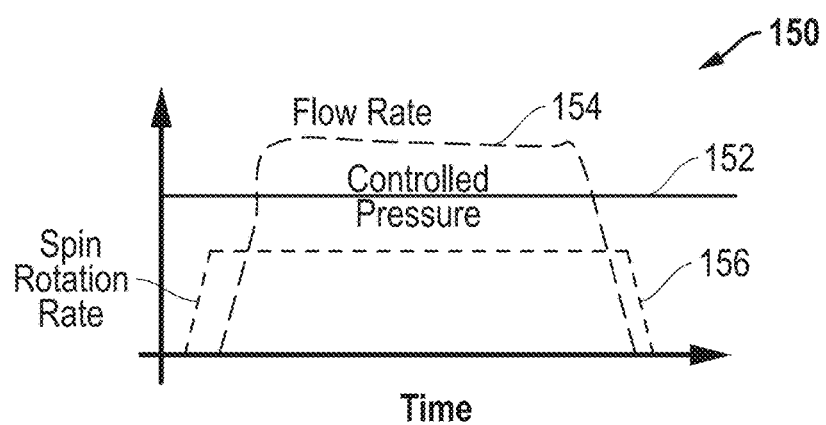
Figure 1C:
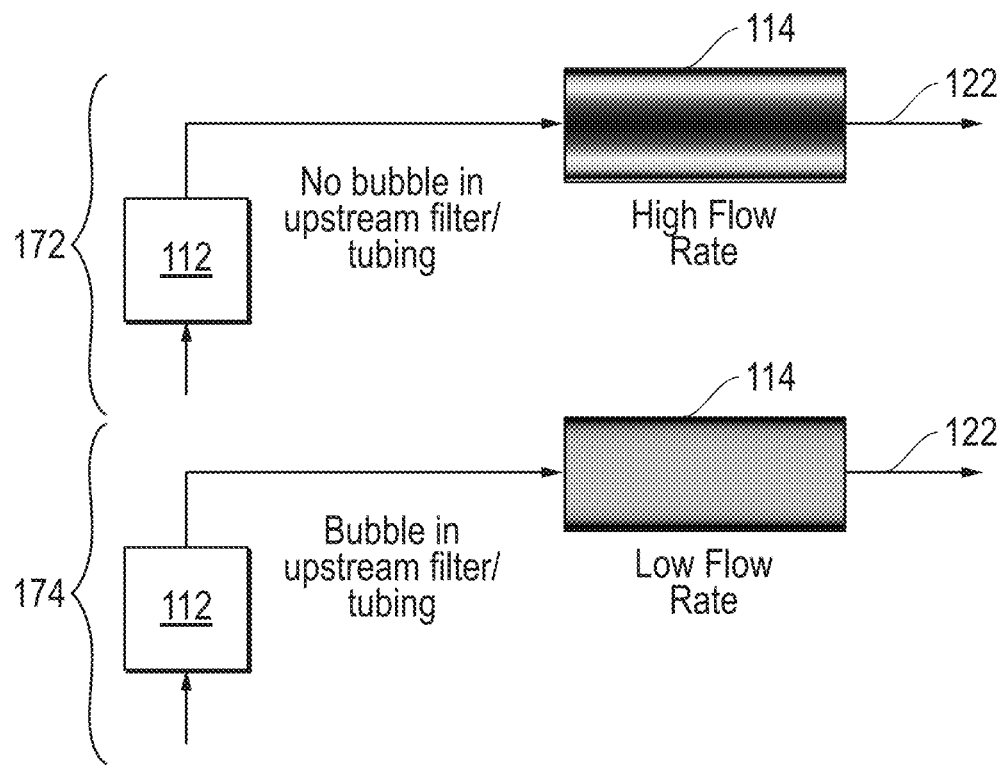
Figure 2A:
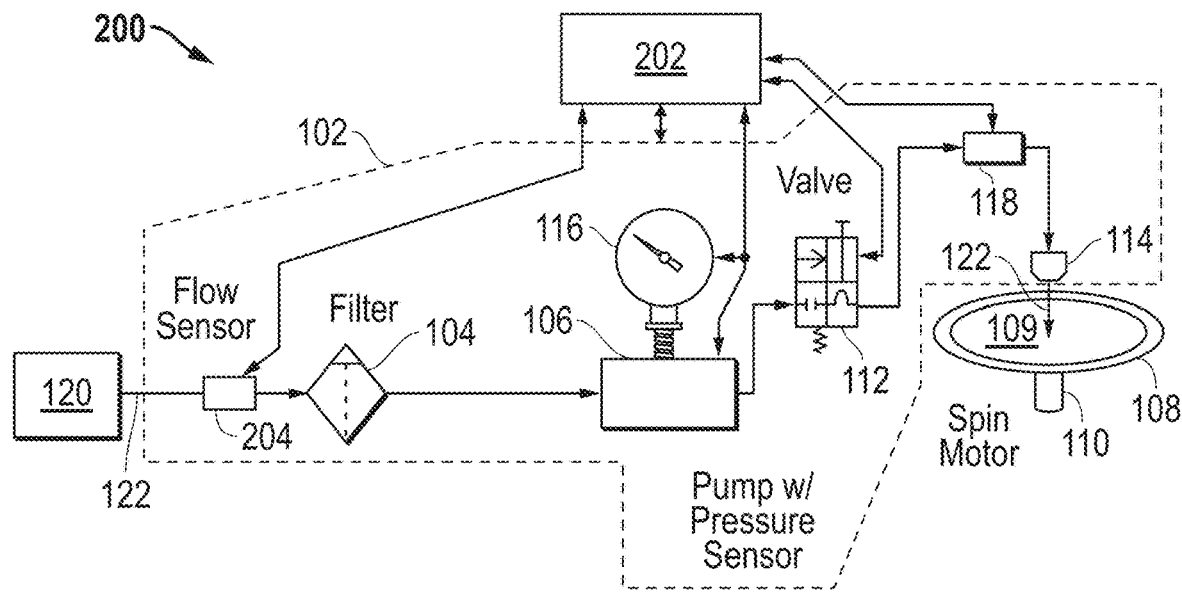
FIGS. 2A-2C provide a first example embodiment where pressure and flow rate sensors are used to determine a delay between a flow change event, such as application of pressure or opening of a valve, and an increase in flow rate and where this delay is used to detect defects, detect conditions, or to detect or adjust other operational details for the dispense system.
Figure 2B:
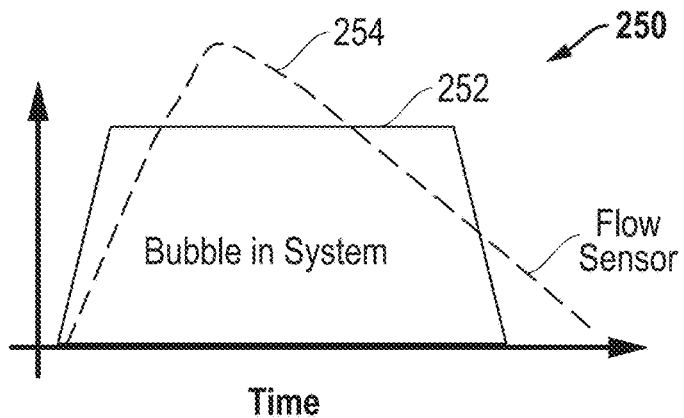
Figure 2C:
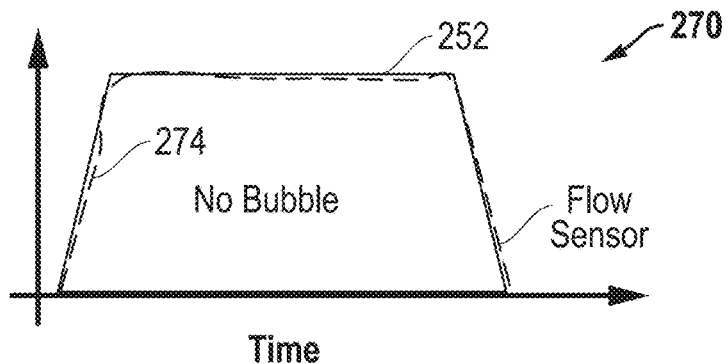
Figure 3A:
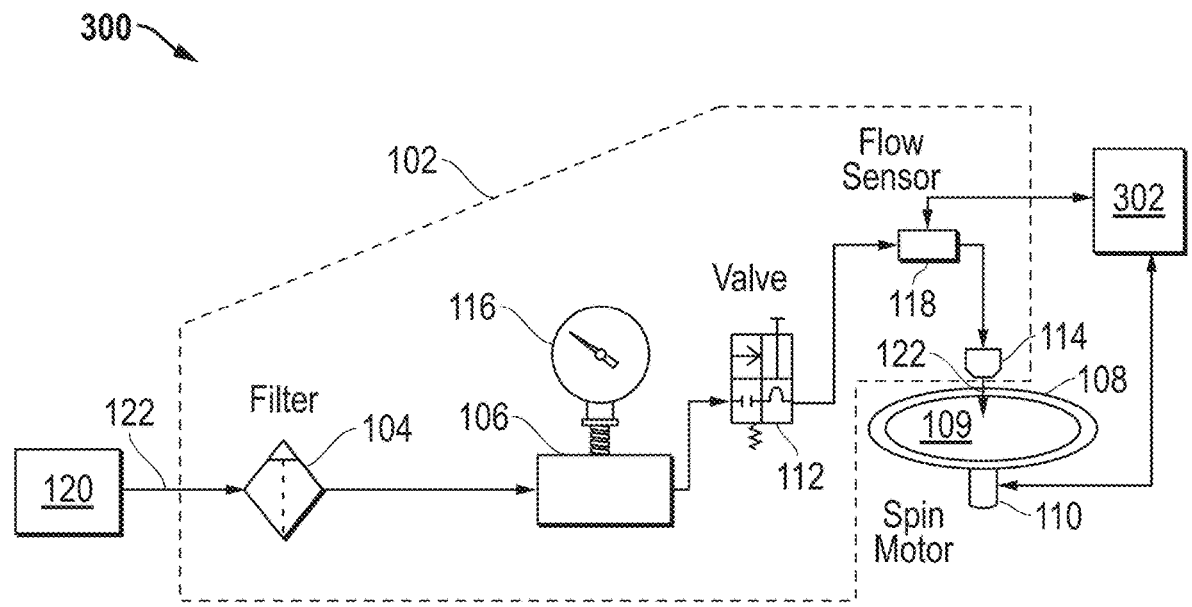
FIGS. 3A-3B provide a second example embodiments where dispense system operation is synchronized using flow rate sensors.
Figure 3B:
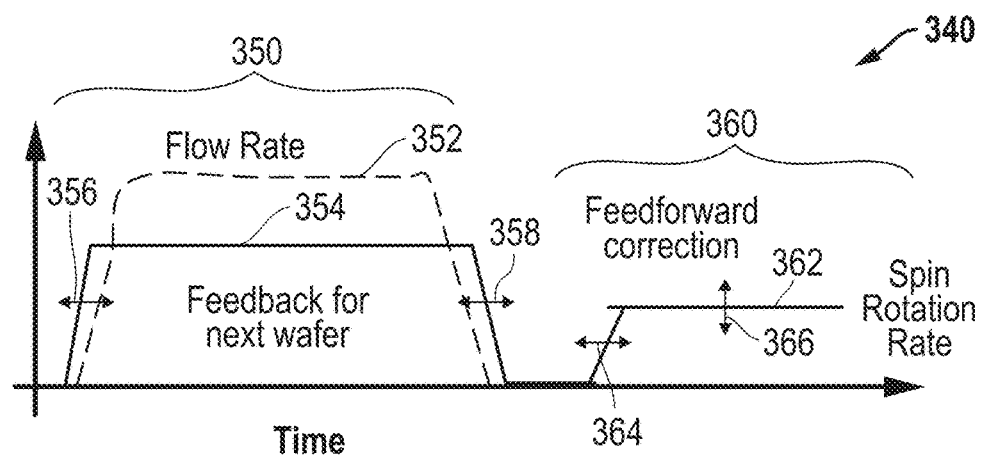
Figure 4A:
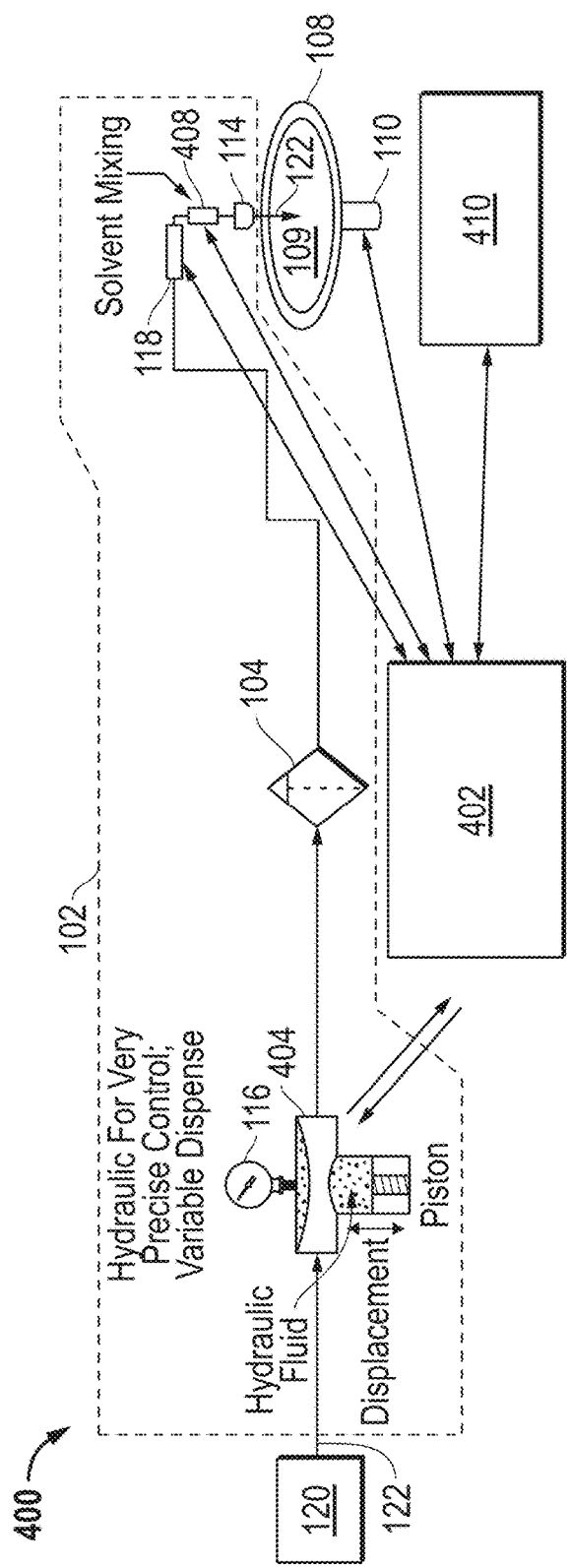
FIGS. 4A-4B provide a third example embodiment where simulation models or complex dispense profiles based upon combined pressure/flow/spin/concentration sensor data are used to enable advanced and complex process recipes.
Figure 4B:
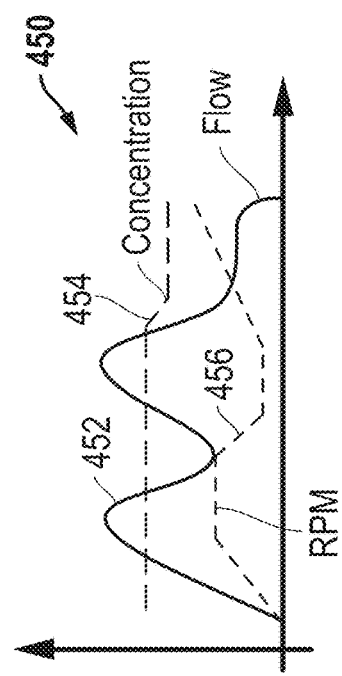
Figure 5:
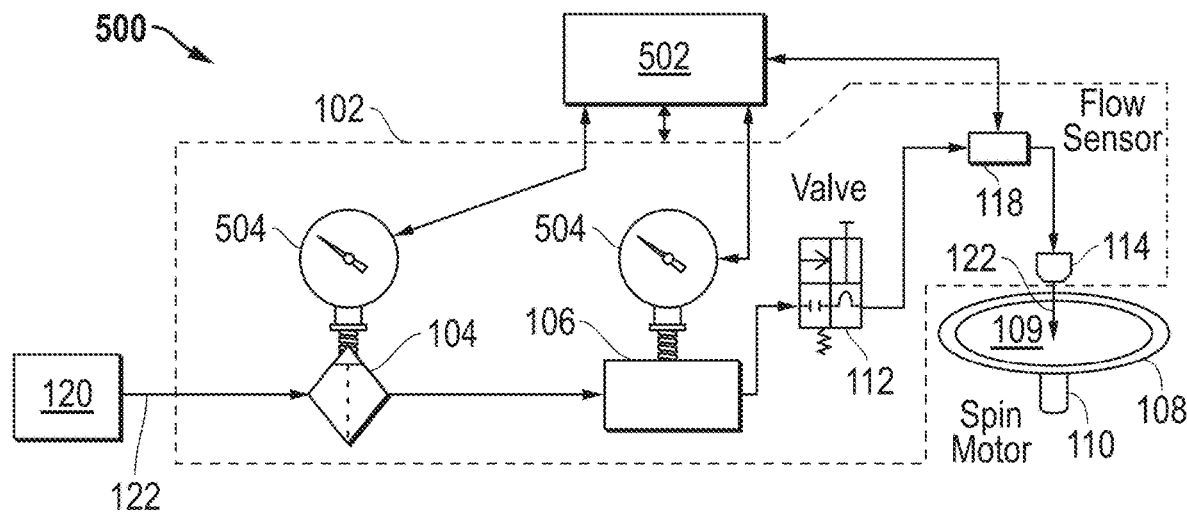
FIG. 5 provides a fourth example embodiment where dispense-to-dispense pressure and/or flow rate measurements are used to detect dispense parameters and defects.
Figure 6:
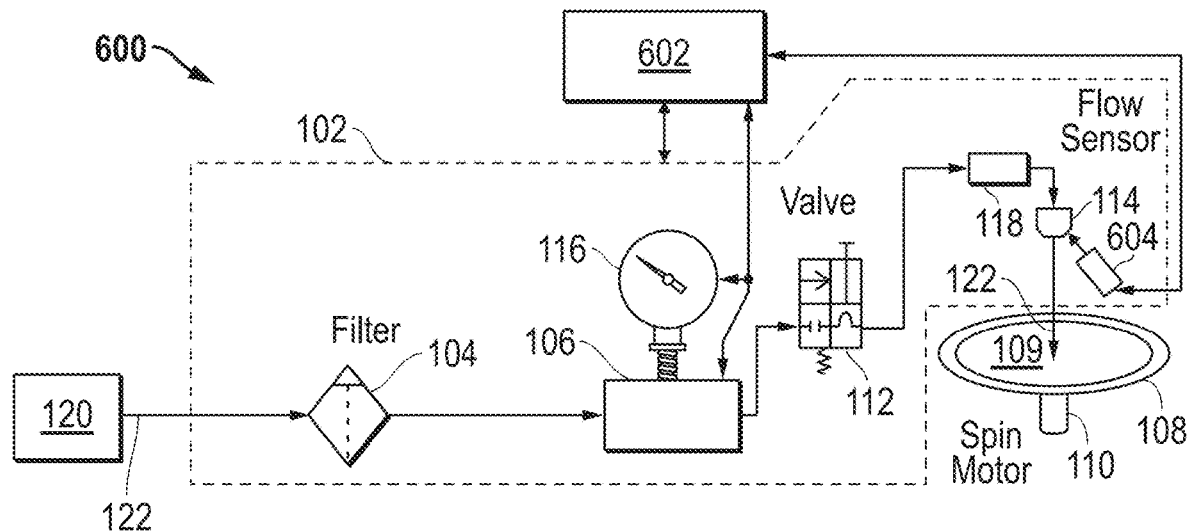
FIG. 6 provides a fifth example embodiment where cameras and image processing are used to detect flow rates from the dispense nozzle and where dispense-to-dispense measurements are used to detect dispense parameters and defects.
Figure 7:
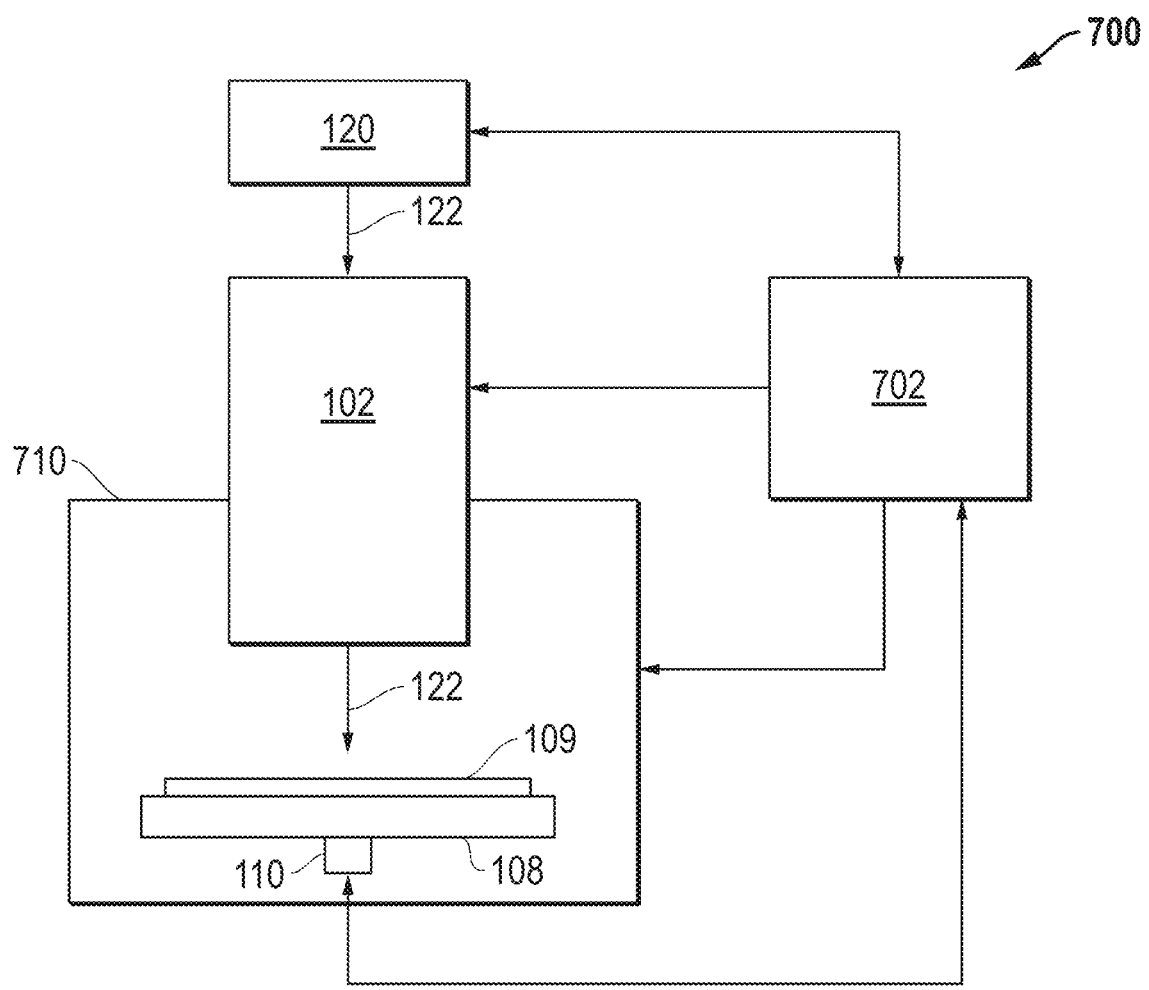
FIG. 7 provides an example embodiment of a processing system for microelectronic workpieces that can take advantage of one or more of these embodiments and techniques described herein.

FIGS. 2A-2C provide a first example embodiment where pressure and flow rate sensors are used to determine a delay between application of pressure and an increase in flow rate and where this delay is used to detect defects or conditions within the dispense system. FIGS. 3A-3B provide a second example embodiments where dispense system operation is synchronized using flow rate sensors. FIGS. 4A-4B provide a third example embodiment where simulation models or complex dispense profiles based upon combined pressure/flow/spin/concentration sensor data are used to enable advanced and complex process recipes. FIG. 5 provides a fourth example embodiment where dispense-to-dispense pressure and/or flow rate measurements are used to detect dispense parameters and defects. FIG. 6 provides a fifth example embodiment where cameras and image processing are used to detect flow rates from the dispense nozzle and where dispense-to-dispense measurements are used to detect dispense parameters and defects. FIG. 7 provides an example embodiment of a processing system for microelectronic workpieces that can take advantage of one or more of these embodiments and techniques described herein.

In certain aspects, disclosed embodiments use a flow sensor and/or a pressure or displacement sensor to monitor, control, and/or synchronize dispense systems. For example, disclosed embodiments can be used (1) to improve time required for startup or filter replacement by identifying when remaining gas has been pushed or dissolved out of the filter, (2) to determine if small amounts of gas bubbles have been introduced to the system that can negatively impact defect density and film thickness uniformity, (3) to determine when a bottle change has changed the solids content of the liquid such that a correction needs to be made to a process recipe, (4) to create a profile of the flow rate through time which can be analyzed to match different coat modules, synchronize the flow to the spin motor, and feed-forward corrections to the spin motor as determined by a model of the coat process, (5) and/or to achieve other improvements to the operations of dispense systems. For certain embodiments, measurements of the flow delay and/or the flow rate through time profiles are used to enable complex and controlled combinations of dispense rate and rotation/spin rate that are not possible with current solutions due to repeatability concerns. Disclosed embodiments can also be used to allow further reduction of the minimum dispense volume, and increased repeatability achieved by the disclosed embodiments can allow lower dispense volumes to be used that are below current dispense volume levels being used in processing systems.

Embodiment 1—Flow/Pressure Profiles

For an incompressible fluid, flow rate will change nearly instantly when pressure is applied or some other flow change event occurs, such as opening of a valve. As such, it can be assumed that delays are an indication of gas bubbles in the dispense system. These gas bubble will tend to cause defects and will make the dispense less consistent especially where a filter is included in the system. By examining the delay between a flow change event (e.g., application of pressure or opening of a valve) and flow rate change, bubble presence and amounts as well as tool performance can be monitored.

As described below, differences between the flow rate and the pressure can be used to display a metric of the presence of gas in the dispense system. Further, differences in flow rate and applied pressure can also be used to determine when the filter has been adequately purged or needs to be replaced. Still further, differences in the flow rate and applied pressure can be used to determine when a viscosity change has occurred for the liquid, such as where a supply bottle change has induced a change in viscosity. For one embodiment, a flow sensor included between a supply tank and a pump can also be used to monitor differences between flow rate and pressure over time during the reloading of a pump.

As also described below, delays between other flow change events and flow rate changes can also be used to determine gas bubbles in the dispense system and/or for other purposes. For example, where the dispense system maintains a controlled pressure prior to the opening of a valve to cause a dispense, delay between valve opening and a flow signal from a flow sensor can be used can be used to determine the presence of a gas bubble in the dispense system. Further, current flow profiles can be compared to desired flow profiles after a flow change event, such as application of pressure or opening of a valve, to determine the presence of a bubble. Further, such delays or flow profiles can be detected and used to maintain consistency between multiple different dispense operations across different runs a particular dispense system or across runs on different dispense systems. Other advantages can also be achieve while still taking advantage of the techniques described herein.

FIG. 2A is a block diagram of an example embodiment of a processing system 200 including a dispense system 102 having a pump 106 with a pressure sensor 116, a flow sensor 204 located between the supply tank 120 and the filter 104, and a flow sensor 118 located between the pump 106 and a nozzle 114. It is noted that the flow sensor 118 can also be positioned in other locations, such as between the supply tank 120 and the pump 106. A controller 202 receives this pressure and sensor information from pressure sensor 116 and flow sensors 118/204 and controls the dispense system 102. The dispense system 102 also includes a filter 104 and a valve 112. The filter 104 is placed between the flow sensor 204 and the pump 106, although it could be positioned in other locations. The supply tank 120 supplies a liquid 122 to the dispense system 102. Within the dispense system 102, the liquid 122 passes through the flow sensor 204, the filter 104, the pump 106, the valve 112, the flow sensor 118, and the nozzle 114. The liquid 122 is then dispensed from the nozzle 114 to a substrate 109 for a microelectronic workpiece. The substrate 109 is held on a substrate holder 108, such as a vacuum chuck. The substrate holder 108 is rotated at a controlled speed by a spin motor no to facilitate distribution of the liquid 122 on the surface of the substrate 109. The liquid 122 can be a photoresist (PR) or other desired liquid.

FIG. 2B is an example embodiment of a diagram 250 for a dispense using the system of FIG. 2A where gas is present in the dispense system 102. As shown, a flow change event 252, such as application of pressure by pump 106 or opening of the valve 112, occurs within the dispense system 102. The corresponding flow rate 254, however, shows a delayed ramp to a peak, followed by a ramp down. The delay in the change in flow rate 254 as compared to the flow change event 252 is indicative of the presence of gas in the dispense system 102. As such, this delay can be used to detect and quantify gas bubbles in the system.

FIG. 2C is an example embodiment of a diagram 270 for a dispense using the system of FIG. 2A where gas is not present in the dispense system 102. As shown, a flow change event 252, such as application of pressure by pump 106 or opening of the valve 112, occurs within the dispense system 102 as was done in FIG. 2A. However, the ramping of the flow rate 274 in FIG. 2C has little or no delay in response to this flow change event 252. This lack of delay in the change in flow rate 274 as compared to the flow change event 252 is indicative of no gas bubbles being present in the dispense system 102.

For one embodiment, the liquid to be dispensed is pre-pressurized with pump 106 prior the opening of valve 112, and the flow change event 252 represents a valve opening signal sent from the valve 112 to the controller 202. A delay between this valve opening signal and the change in flow rate 254 can be used by the controller 202 to determine the presence of gas bubbles in the liquid to be dispensed. In contrast, a lack of delay between this valve opening signal and the change in flow rate 274 can be used by the controller 202 to determine the lack of gas bubbles in the liquid to be dispensed.

For one embodiment, pressure/flow profile comparisons are used to determine the presence and quantity of gas in the system which can increase defects. For additional embodiments, flow magnitude at a controlled pressure can be used to provide information about the viscosity of the fluid or condition of the filter, and this information can be provided to the user of the dispense system. Additionally, the control allowed by the disclosed embodiments can be used to achieve uniform and/or repeatable dispenses without requiring a constant pressure during the dispense, which is required in many prior solutions. Because a constant pressure requires time to allow the dispense system to come to equilibrium, removing this restriction allows for faster throughput or additional time for slower filtration, which typically improves filtration results.

For one embodiment, pressure and flow rate are monitored during the portion of the dispense cycle for the dispense system 102 when the pump 106 is refilled, and this monitoring is used to determine a condition for the pump such as when the reloading has completed successfully. Further, the rate of flow at a given applied pressure provides information which can be related to operations such as (1) the timing of bottle change, (2) to determine if viscosity has shifted, (3) the timing of filter replacement, (4) to understand filter lifetime, (5) to understand filter priming and whether enough gas has been removed to make full use of the filter membrane, (6) the module number to understand a potential difference in defect performance, and/or (7) other conditions of the dispense system 102.

For one embodiment, information about gas in the filter 104 is gained by comparing the timing of pressure versus flow signals during the reloading of the pump 106. To provide these comparisons, the flow sensor 204 is included between the chemical source, which is provided by the supply tank 120, and the pump 106. For one further embodiment, the pressure is ramped up during the pump reload step instead of leaving the pressure at a pre-adjusted level. The flow and pressure can then be compared.

For one embodiment, pressure/flow comparisons are used to determine a condition of the filter 104. These comparisons allow filter performance to be compared, filter lifetime (e.g., pressure should increase over time) to be better understood. As the filter ages, it will collect more particles which block available pathways through the filter membrane, and this increase in particles in turn increases the pressure drop across the filter 104 and increases the flow rate through the remaining channels in the filter 104. Both of these effects are often correlated with increases in defects. For example, any gas present in the liquid 122 can become a nucleation site for defects. Understanding the flow caused by pressure downstream will show when the filter performance has degraded and predictive maintenance is needed. Further, the mean flow rate at a given pressure can be tracked and compared by module, by time since filter change, or by time since bottle change.

For one embodiment, a change in flow rate at an applied pressure is used to indicate the viscosity of the liquid 122 has changed. For example, if viscosity changes, an adjustment may be needed to the drying rotation rate of the spin motor 110.

The pressure/flow comparisons and profiles can also be used to detect other conditions of the dispense system 102.

Embodiment 2—Flow/Spin Synchronization

As shown in FIG. 2A, a flow sensor 118 can be included between the pump and nozzle 114. This flow sensor 118 as well as a sensor (not shown) monitoring the spin rate of the spin motor 110 (e.g., in time increments in the 10 s of milliseconds) can be used to develop sensor profiles that correlate flow rate to spin rate. These flow/spin sensor profiles can be used to adjust the rotation rate of the spin motor 110 with respect to flow rates in a process recipe to achieve consistent or identical thickness uniformity for the dispensed liquid 122.

FIG. 3A is a block diagram of an example embodiment of a processing system 300 including a dispense system 102 having controller 302 configured to synchronize the spin rate for spin motor 110 to the flow rate detected using flow sensor 118. Applying this synchronization, the controller 302 in part can achieve a target uniformity in thickness for the liquid 122 applied to the substrate 109 for a microelectronic workpiece. The dispense system 102 also includes a filter 104, a pump 106, a valve 112, and a nozzle 114. The supply tank 120 supplies a liquid 122 to the dispense system 102. Within the dispense system 102, the liquid 122 passes through the filter 104, the pump 106, the valve 112, the flow sensor 118, and the nozzle 114. The liquid 122 is then dispensed from the nozzle 114 to a substrate 109 for a microelectronic workpiece. The substrate 109 is held on a substrate holder 108, such as a vacuum chuck. The substrate holder 108 is rotated at a controlled speed by a spin motor 110 to facilitate distribution of the liquid 122 on the surface of the substrate 109. The liquid 122 can be a photoresist (PR) or other desired liquid.

In operation, the flow rate detected by the flow sensor 118 positioned between the pump 106 and the nozzle 114 is combined by the controller 302 with detailed information for the spin rate from the spin motor 110. While flow sensor information and spin rate information have been obtained before, the embodiment of FIG. 3 samples this information at a high rate (e.g., at a sample rate of at least one sample every 50 milliseconds (ms) or less and preferably 10 ms or less) and then matches profiles of the sampled values from each sensor through time. If a shift in the delta of the two profiles occurs from wafer-to-wafer or from module-to-module, this shift can cause a degradation in thickness uniformity. If a shift is observed by the controller 302 through the profile matching, the controller 302 can use a feedback or feedforward control loop to maintain thickness uniformity. For example, in a feedback loop, the timing of the spin motor 110 can be adjusted for the next wafer or microelectronic workpiece. As such, for the feedback implementation, the spin motor 110 is adjusted to match flow. In a feedforward loop, later steps in the spin recipe can be adjusted to improve the thickness uniformity on the same wafer or microelectronic workpiece. As such, in a feedforward implementation, the casting speed and/or reflow step for later process steps for the same wafer are adjusted to better match target thickness on the same wafer.

FIG. 3B is an example embodiment of a diagram 340 for a dispense using the system of FIG. 3A where feedback and/or feedforward loops are applied to synchronize flow rates and spin rates. For a dispense 350, the flow rate 352 for the liquid 122 and the spin rate 354 for the spin motor no are sampled and provided to controller 302. For example, this sampling can occur at a sample rate of at least one sample every 50 ms or less and preferably 10 ms or less. The controller 302 determines if there is any change in the current flow/spin rates as compared to a base profile or as compared to prior wafers or process runs. For a feedback implementation, this flow/spin rate comparison is used by the controller 302 to make one or more adjustments to flow/spin parameters for the next wafer or microelectronic workpiece to be processed. For example, the controller 302 can make an adjustment 356 to the start timing, an adjustment 358 for the end timing, and/or another adjustment. For a feedforward implementation, this flow/spin rate comparison is used by the controller 302 to make one or more adjustments to parameters for later process steps applied to the same wafer or microelectronic workpiece. For example, in a later process step 260, the spin rate for the spin motor 110 can be adjusted by the controller 302 such as to make an adjustment 364 to the start timing, an adjustment 366 to the magnitude of the spin rate 362, and/or another adjustment.

Embodiment 3—Pressure/Flow/Spin/Concentration Profiles

In addition to the embodiments of FIGS. 2A-2C and FIGS. 3A-3B, pressure, flow, spin and/or concentration information can be used to control more complicated dispense recipes with a repeatability that is not possible in current solutions. For example, dispense recipes that are sensitive to pressure/flow/spin/concentration timing could be implemented and used with the disclosed techniques.

FIG. 4A is a block diagram of an example embodiment of a processing system 400 including a dispense system 102 having a hydraulic pump 404 and a controller 402 configured to apply feedforward and/or feedback control. The dispense system 102 also includes a filter 104, a flow sensor 118, and a nozzle 114. The supply tank 120 supplies a liquid 122 to the dispense system 102. Within the dispense system 102, the liquid 122 passes through the filter 104, the pump 106, the valve 112, the flow sensor 118, and the nozzle 114. In addition, the dispense system 102 can include a mixer 408 configured to provide solvent mixing of the liquid 122 with one or more solvents prior to being dispensed through the nozzle 114. The liquid 122 is then dispensed from the nozzle 114 to a substrate 109 for a microelectronic workpiece. The substrate 109 is held on a substrate holder 108, such as a vacuum chuck. The substrate holder 108 is rotated at a controlled speed by a spin motor 110 to facilitate distribution of the liquid 122 on the surface of the substrate 109. The liquid 122 can be a photoresist (PR) or other desired liquid.

The controller 402 controls the hydraulic pump 404, the solvent mixing for the mixer 408, the spin rate for the spin motor 110, and/or other components. The controller 402 also receives pressure data from a pressure sensor 116 associated with the hydraulic pump 404, flow rate data from the flow sensor 118, spin rate data from the spin motor 110, and/or other operational data. The controller 402 can also use one or more models 410 to control the operation of the dispense system 102. For example, coat simulation models can be used to determine ideal dispense profiles and/or recipe combinations for chemistry and surface contact angle, and these coat simulation models can be applied by controller 402 to control the components of the dispense system 102.

The hydraulic pump 404 facilitates precise control of the pressure and provides variable dispense rates. The piston for the hydraulic pump 404 is adjusted by the controller 402 to control the displacement of the hydraulic fluid. The pressure and flow rate for the liquid 122 are dependent upon this displacement as controlled by the controller 402. The hydraulic pump 404 also allows for the embodiment 400 to be implemented without a valve.

The controller 402 can provide feed-forward and/or feedback control. For example, feed-forward adjustments can be made by the controller 402 to adjust the hydraulic pump 404 and/or the spin motor 110 based upon delays in flow rate after application of pressure. In addition, the improved repeatability and synchronization provided by controller 402 allows for complex dispense profiles to be used. For example, the controller 402 can receive pressure information from the pressure sensor 116, flow rate information from the flow sensor 118, and spin rate information from the spin motor 110; and the controller 402 can use this information to adjust the pressure, the flow rate, and the spin rate to achieve target parameters. For example, using these techniques, identical dispenses can be conducted from wafer to wafer. In addition, the dispense can be optimized for minimum volume and/or for pressure stability.

In operation, any desired combination of a flow rate through time, rotation rate through time, and concentration through time can be applied using controller 402. Further, use of a hydraulic pump 404 allows a displacement reading from the pump 404 to replace the pressure sensor 116 in FIG. 2A and FIG. 3A, for example, when monitoring the system for gas bubbles, module-to-module differences, and/or other pressure based analysis. For example, the displacement of the piston can be automatically adjusted to achieve the desired flow rate profile in real time. The flow rate profile can also be synchronized to the rotation rate of the spin motor 110 and/or to the solvent/polymer mix of the coating liquid 122 provided by mixer 408. A simulation-based model of the coat process can be used as one of the models 410 to achieve and maintain a desired thickness uniformity of the film formed by the dispensed liquid 122. For certain embodiments, the simulation model can be a computational fluid dynamics simulation based on the chemical properties, can be a simplified model based on regression of empirical data, and/or other models. Still further, if there is a change, such as an unavoidable change, in one of the three flow/spin/concentration profiles, the other profiles can be adjusted to compensate. Also if other sensors within or outside the dispense system 102 indicate changes to the thickness uniformity, one or more of the three profiles can be adjusted to maintain uniformity.

FIG. 4B is an example embodiment of a diagram 450 for a dispense using the system of FIG. 4A where a complex profile is applied by controller 402. As shown, a complex flow rate 452 for the liquid 122 is applied along with a complex spin rate 456 for the spin motor 110. In addition, the concentration 454 for the solvent mixing provided by mixer 408 is also adjusted over time. Other dispense parameters can also be adjusted using complex profiles based upon the additional control provided by controller 402 within the embodiment 400.

Embodiment 4—Dispense-to-Dispense Monitoring

In certain respects, disclosed embodiments provide dispense-to-dispense improvements through additional sensor systems and/or sensor-based signal analysis methods. These disclosed embodiments offer additional monitoring and/or analysis methods that improve dispense parameters, provide dispense flow rate matching, and provide abnormality/excursion monitoring. The disclosed embodiments achieve tighter dispense-to-dispense control and dispense repeatability as compared to prior solutions. For example, the disclosed embodiments improve flow rate control within a dispense as well as improving flow rate control over time from dispense-to-dispense. Further, the disclosed embodiments allow more rapid detection of dispense system excursions that affect dispense flow rate to reduce the number of wafers that will need rework. These excursions include gas bubbles introduced in the filter or pump, viscosity changes, filter clogging or contamination monitoring, and/or other system excursions.

FIG. 5 is a block diagram of an example embodiment of a processing system 500 including a dispense system 102 having one or more pressure sensors 504 and having one or more flow sensors 118 to facilitate detection of system excursions. For example, a pressure monitoring system is achieved by adding a pressure sensor 504 across the filter 104 for the dispense system 102, across the pump 106 for the dispense system 102, or both. A pressure sensor 504 could also be added in different or additional locations within the dispense system 102. Flow rate monitoring is achieved by adding a flow sensor 118 between the valve 112 and the nozzle 114, and flow rate sensors could be located in different or other locations. A controller 502 receives pressure information from pressure sensors 504 and flow rate information from the flow rate sensor 118, and the controller 502 controls the dispense system 102. The dispense system 102 also includes a filter 104 and a pump 106 located between the supply tank 120 and the valve 112. The supply tank 120 supplies a liquid 122 to the dispense system 102. Within the dispense system 102, the liquid 122 passes through the filter 104, the pump 106, the valve 112, the flow sensor 118, and the nozzle 114. The liquid 122 is then dispensed from the nozzle 114 to a substrate 109 for a microelectronic workpiece. The substrate 109 is held on a substrate holder 108, such as a vacuum chuck. The substrate holder 108 is rotated at a controlled speed by a spin motor 110 to facilitate distribution of the liquid 122 on the surface of the substrate 109. The liquid 122 can be a photoresist (PR) or other desired liquid.

In operation, a dispense-to-dispense (e.g., $D_n$ to $D_{n-1}$) comparison of pressure signals or flow rate signals or both can be performed to identify gas bubbles that may be present in the dispense system 102. These gas bubbles can induce significant pressure and/or flow rate fluctuations that will affect dispense rate control at the wafer instantaneously. For example, due to the compressibility difference of liquid versus gas, gas bubbles in the liquid 122 cause significant fluctuations between a dispense where gas bubbles are present as compared to a dispense where gas bubbles are not present. Further, a comparison of pressure signals and/or flow rate signals for a current dispense to prior dispenses (e.g., $D_n$ to $D_{n-1}$, $D_n$ to $D_{n-2}$, $D_n$ to $D_{n-3}$, . . . ) can be performed to identify material viscosity changes that have occurred in the dispense system 102. These viscosity changes can induce significant pressure/flow signal shifts and trends over a relative short number of iterations. Sill further, a comparison of pressure signals and/or flow rate signals for a current dispense to prior dispenses occurring over a larger time frame (e.g., $D_n$ to $D_{n-500}$, $D_n$ to $D_{n-1000}$, $D_n$ to $D_{n-1500}$, . . . ) can be performed to identify particle buildup in the filter 104 for the dispense system 102. Particle buildup will inevitably occur in the filter 104, and this particle buildup can induce significant pressure signal and/or flow rate changes or trends that are detectable over a longer time frame of dispense iterations. These changes or trends can be used to determine when the filter 104 needs to be cleaned or replaced.

Embodiment 5—Image-Based Dispense-to-Dispense Monitoring

Video monitoring of a dispense nozzle has been provided in prior solutions, and this video monitoring operates to monitor nozzle angle and position, nozzle contamination, dispense presence (on/off), dispense timing (time start delay, end delay), bubble presence, and suckback position as well as maintenance support of suckback setup and nozzle centering. However, these prior systems used a camera operating at 120 frames-per-second (fps) or less. It has been recognized in the disclosed embodiment, as described below, that increasing the frame rate to 500 fps or greater, and preferably to 2000 fps or greater, allows the flow rate to be accurately determined. For example, by applying image processing using edge detection algorithms, the front edge position of the liquid 122 can be detected over multiple frames as it flows from the nozzle 114 through the gap between nozzle 114 and the substrate 109. The flow rate can then be determined, for example, at flow start and flow end through the nozzle 114.

FIG. 6 is a block diagram of an example embodiment of a processing system 600 including a dispense system 102 having a camera 604 to facilitate detection of flow rates in addition to other parameters. A controller 602 receives this image data from the camera 604 as well as pressure information from pressure sensor 116 and controls the dispense system 102. The dispense system 102 also includes a filter 104, a pump 106 with a pressure sensor 116, a valve 112, a flow sensor 118, and a nozzle 114. The supply tank 120 supplies a liquid 122 to the dispense system 102. Within the dispense system 102, the liquid 122 passes through the filter 104, the pump 106, the valve 112, the flow sensor 118, and the nozzle 114. The liquid 122 is then dispensed from the nozzle 114 to a substrate 109 for a microelectronic workpiece. The substrate 109 is held on a substrate holder 108, such as a vacuum chuck. The substrate holder 108 is rotated at a controlled speed by a spin motor 110 to facilitate distribution of the liquid 122 on the surface of the substrate 109. The liquid 122 can be a photoresist (PR) or other desired liquid.

In operation, the camera 604 captures images of the liquid 122 as it is dispensed from the nozzle 114, and these images are captured at 500 fps or more and preferably at 2000 fps or more. A controller then receives and processes the image data from the camera 604 to determine liquid flow rates. For example, accounting for geometry, the flow rate versus time at dispense start and dispense end can be estimated with edge detection algorithms in video frame-by-frame analysis. This flow rate detection can be used in part to achieve better dispense start and dispense end reproducibility module-to-module. Further, flow rate information extracted from the image data can be combined with pressure information and/or other information received by the controller 602 to facilitate determination of operational conditions. Further, initial flow rate (as well as end of dispense flow rate) versus time comparisons can be performed dispense-to-dispense (e.g., $D_n$ to $D_{n-1}$) to identify gas bubbles that may be present in the dispense system 102. These gas bubbles can induce significant pressure fluctuations that will affect dispense rate control at the wafer instantaneously. For example, due to the compressibility difference of liquid versus gas, gas bubbles in the liquid 122 cause these significant fluctuations between a dispense where gas bubbles are present as compared to a dispense where gas bubbles are not present. Further, a comparison of a flow rate for a current dispense to prior dispenses (e.g., $D_n$ to $D_{n-1}$, $D_n$ to $D_{n-2}$, $D_n$ to $D_{n-3}$, . . . ) can be performed to identify material viscosity changes that have occurred in the dispense system 102. These viscosity changes can induce significant pressure signal shifts/trends over a relative short number of iterations. Sill further, a comparison of flow rate for a current dispense to prior dispenses occurring over a larger time frame (e.g., $D_n$ to $D_{n-500}$, $D_n$ to $D_{n-1000}$, $D_n$ to $D_{n-1500}$, . . . ) can be performed to identify particle buildup in the filter 104 for the dispense system 102. Particle buildup will inevitably occur in the filter 104, and this particle buildup can induce significant pressure signal changes or trends that are detectable over a longer time frame of dispense iterations. These changes or trends can be used to determine when the filter 104 needs to be cleaned or replaced.

Embodiment 6—Processing System Environment

FIG. 7 is an example embodiment of a processing system 700 FIG. 7 for a microelectronic workpiece that can use one or more of the embodiments described herein. As described herein, the processing system 700 can include pressure sensors, flow sensors, and/or flow detectors in a dispense system 102 to facilitate the dispense of materials within a process chamber 710 for the processing system 700. The substrate 109 is positioned within the process chamber 710. Further, the substrate 109 (in one example a semiconductor wafer) is held on a substrate holder 108, such as a vacuum chuck. A spin motor 110 can be configured to rotate the substrate holder 108 at a controlled speed to facilitate formation of a film layer on the surface of the substrate 109. The rotation and rotation speed can be controlled, for example, by the controller 702. The supply tank 120 provides the liquid 122 to the dispense system 102, and the liquid 122 is dispensed on the substrate 109. The dispense system 102 and related components can be implemented using one or more of the embodiments described herein.

The controller 702 is coupled to receive sensor, control, and operation information from the components of the processing system 700, and the controller operates to control the components and to achieve the functions described herein. The controller 702 represents the controller 202 in FIG. 2A, the controller 302 in FIG. 3A, the controller 402 in FIG. 4A, the controller 502 in FIG. 5A, and/or the controller 602 in FIG. 6A. The controller 702 can be implemented in a wide variety of manners. For example, the controller 702 may be a computer. In another example, the controller 702 includes one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a prescribed plasma process recipe. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to dispense liquid for a microelectronic workpiece processing system, comprising:
   receiving a liquid to be dispensed with a dispense system;
   dispensing the liquid on a microelectronic workpiece;
   rotating the microelectronic workpiece at a spin rate during the dispensing;
   sensing a flow rate for the liquid during the dispensing, wherein the sensing the flow rate occurs at a flow rate sample rate of at least one sample every 50 milliseconds or less; and
   synchronizing the flow rate and the spin rate.

2. The method of claim 1, wherein the synchronizing achieves a target uniformity in thickness for the dispensing of the liquid on the microelectronic workpiece.

3. The method of claim 1, further comprising obtaining spin rate information at a spin rate sample rate of at least one sample every 50 milliseconds or less.

4. The method of claim 2, further comprising performing at least one of a feedback adjustment by adjusting a spin rate used to process a subsequent microelectronic workpiece or a feedforward adjustment by adjusting a spin rate used to process a same microelectronic workpiece in a later process step.

5. The method of claim 4, further comprising obtaining spin rate information at a spin rate sample rate of at least one sample every 50 milliseconds or less.

6. The method of claim 1, further comprising performing at least one of a feedback adjustment by adjusting a spin rate used to process a subsequent microelectronic workpiece or a feedforward adjustment by adjusting a spin rate used to process a same microelectronic workpiece in a later process step.

7. A method to dispense liquid for a microelectronic workpiece processing system, comprising:
   receiving, from a pump, a liquid to be dispensed at a nozzle of a dispense system comprising a filter, the pump, a valve, and the nozzle;
   dispensing, through the nozzle, the liquid on a microelectronic workpiece;
   rotating, using a spin motor, the microelectronic workpiece at a spin rate during the dispensing;
   sensing, at a flow sensor, a flow rate for the liquid during the dispensing, the flow sensor being fluidly coupled between the pump and the nozzle; and
   synchronizing the flow rate and the spin rate, the synchronizing comprising sampling, at a controller, the flow rate at a sampling rate of at least one sample every 50 ms or less.

8. The method of claim 7, wherein the synchronizing comprises:
   combining, at the controller, the sampled flow rate and the spin rate to determine a shift from a target.

9. The method of claim 8, further comprising
   correcting the shift by performing a feedback adjustment.

10. The method of claim 9, wherein the feedback adjustment comprises adjusting a spin rate used to process a subsequent microelectronic workpiece.

11. The method of claim 9, wherein the feedback adjustment comprises adjusting a start timing of the spin motor for a subsequent microelectronic workpiece.

12. The method of claim 9, wherein the feedback adjustment comprises adjusting an end timing of the spin motor for a subsequent microelectronic workpiece.

13. The method of claim 8, further comprising
   correcting the shift by performing a feedforward adjustment.

14. The method of claim 13, wherein the feedforward adjustment comprises adjusting casting speed and/or reflow step for later process steps for the microelectronic workpiece.

15. A microelectronic workpiece processing system comprising:
- a dispense system comprising a filter, a pump, a valve, and a nozzle, the pump configured to deliver a liquid to the nozzle, the nozzle being configured to dispense the liquid on a microelectronic workpiece;
- a controller configured to provide a spin rate to a spin motor;
- a flow sensor configure to sense a flow rate for the liquid during the dispensing and provide the sensed flow rate to the controller, wherein the controller is configured to sample the sensed flow rate at a sampling rate of at least one sample every 50 ms or less; and
- a spin motor configured to spin the microelectronic workpiece at a spin rate during the dispensing, the controller configured to obtain the sensed flow rate and synchronize the flow rate and the spin rate.

16. The system of claim 15, wherein the controller is configured to:
- combine the sampled flow rate and the spin rate to determine a shift from a target; and
- synchronize the flow rate and the spin rate based on the shift.

17. The system of claim 16, wherein the controller is configured to:
- correct the shift by performing a feedback adjustment.

18. The system of claim 17, wherein the feedback adjustment comprises adjusting a spin rate used to process a subsequent microelectronic workpiece.

19. The system of claim 17, wherein the feedback adjustment comprises adjusting a timing of the spin motor for a subsequent microelectronic workpiece.

* * * * *